United States Patent
Kwon et al.

(10) Patent No.: US 10,013,341 B2
(45) Date of Patent: Jul. 3, 2018

(54) SEMICONDUCTOR MEMORY DEVICE HAVING RANK INTERLEAVING OPERATION IN MEMORY MODULE

(71) Applicant: SAMSUNG ELECTRONICS CO., LTD., Suwon-si, Gyeonggi-Do (KR)

(72) Inventors: Oh-Seong Kwon, Seoul (KR); Jinhyun Kim, Yongin-si (KR); Won-Hyung Song, Osan-si (KR); Jihyun Choi, Daegu (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/371,825

(22) Filed: Dec. 7, 2016

(65) Prior Publication Data

US 2017/0168746 A1    Jun. 15, 2017

(30) Foreign Application Priority Data

Dec. 9, 2015    (KR) .................. 10-2015-0175237

(51) Int. Cl.
| | | |
|---|---|---|
| *G06F 12/00* | (2006.01) | |
| *G06F 12/02* | (2006.01) | |
| *G06F 3/06* | (2006.01) | |
| *G11C 8/18* | (2006.01) | |
| *G11C 5/04* | (2006.01) | |
| *G11C 7/10* | (2006.01) | |
| *G11C 8/12* | (2006.01) | |
| *G11C 11/4076* | (2006.01) | |
| *G11C 11/408* | (2006.01) | |
| *G11C 11/4093* | (2006.01) | |

(52) U.S. Cl.
CPC ............ *G06F 12/00* (2013.01); *G06F 3/0604* (2013.01); *G06F 3/0629* (2013.01); *G06F 3/0683* (2013.01); *G06F 12/02* (2013.01); *G11C 5/04* (2013.01); *G11C 7/1057* (2013.01); *G11C 8/12* (2013.01); *G11C 8/18* (2013.01); *G11C 7/1042* (2013.01); *G11C 11/408* (2013.01); *G11C 11/4076* (2013.01); *G11C 11/4093* (2013.01); *G11C 2207/2209* (2013.01)

(58) Field of Classification Search
CPC .... G06F 3/0629; G06F 3/0604; G06F 3/0683; G06F 12/00; G11C 8/18
See application file for complete search history.

(56) References Cited

U.S. PATENT DOCUMENTS

| | | |
|---|---|---|
| 5,172,379 A | 12/1992 | Burrer et al. |
| 5,321,697 A | 6/1994 | Fromm et al. |
| 5,852,586 A | 12/1998 | Fujita |
| 5,867,642 A | 2/1999 | Vivio et al. |
| 6,131,150 A | 10/2000 | DeTreville |
| 6,553,449 B1 | 4/2003 | Dodd et al. |
| 8,250,295 B2 | 8/2012 | Amidi et al. |

(Continued)

*Primary Examiner* — Ajay Ojha
(74) *Attorney, Agent, or Firm* — F. Chau & Associates, LLC.

(57) ABSTRACT

A semiconductor memory device includes a first memory area in the semiconductor memory device, and a second memory area in the semiconductor memory device. The second memory area is accessed independently of the first memory area based on a usage selecting signal. The first and second memory areas share command and address lines, and perform a rank interleaving operation based on the usage selecting signal.

16 Claims, 16 Drawing Sheets

(56) References Cited

U.S. PATENT DOCUMENTS

| | | | |
|---|---|---|---|
| 8,892,942 B2 | 11/2014 | Warnes et al. | |
| 8,984,313 B2 | 3/2015 | Bhandaru et al. | |
| 9,001,548 B2 | 4/2015 | Jeddeloh | |
| 2004/0193777 A1* | 9/2004 | LaBerge | G06F 13/4022 |
| | | | 711/5 |
| 2008/0229029 A1* | 9/2008 | Kang | G11C 8/18 |
| | | | 711/149 |
| 2009/0089493 A1* | 4/2009 | Ikeda | G11C 7/1042 |
| | | | 711/105 |
| 2010/0020583 A1* | 1/2010 | Kang | G11C 5/02 |
| | | | 365/51 |
| 2011/0156232 A1* | 6/2011 | Youn | G11C 5/02 |
| | | | 257/686 |
| 2013/0138898 A1* | 5/2013 | Osanai | G06F 12/00 |
| | | | 711/154 |
| 2013/0256917 A1* | 10/2013 | Kim | H01L 24/46 |
| | | | 257/777 |
| 2013/0322162 A1* | 12/2013 | Lee | G11C 7/12 |
| | | | 365/158 |
| 2014/0013086 A1 | 1/2014 | Gopal et al. | |
| 2014/0052906 A1 | 2/2014 | Thyagarajan et al. | |
| 2014/0068169 A1 | 3/2014 | Ware et al. | |
| 2014/0082378 A1 | 3/2014 | Schluessler et al. | |
| 2015/0106560 A1* | 4/2015 | Perego | G06F 12/10 |
| | | | 711/105 |
| 2017/0093571 A1* | 3/2017 | Satpathy | H04L 9/10 |
| 2017/0345475 A1* | 11/2017 | Lee | G11C 11/161 |

\* cited by examiner

SEMICONDUCTOR MEMORY DEVICE HAVING RANK INTERLEAVING OPERATION IN MEMORY MODULE

CROSS-REFERENCE TO RELATED APPLICATIONS

This application claims priority under 35 U.S.C. § 119 to Korean Patent Application No. 10-2015-0175237 filed on Dec. 9, 2015, the disclosure of which is hereby incorporated by reference in its entirety.

TECHNICAL FIELD

Exemplary embodiments of the inventive concept described herein relate to a semiconductor memory device, and more particularly, to a semiconductor memory device that performs a rank interleaving operation in a memory module.

DISCUSSION OF THE RELATED ART

A semiconductor memory device may be mounted on a memory module for use in a memory system. The semiconductor memory device may be connected to a memory controller through a transmission line that transmits signals. The signals may refer to data, an address, and a command. As semiconductor fabrication processes improve, the storage capacity of semiconductor memory devices has increased. Double data rate 4 (DDR4) dynamic random access memories (DRAMs) are a type of memory that may be used in a dual in-line memory module (DIMM). The memory capacity of a DDR4 DRAM may be approximately 16 Gb (Gigabit).

SUMMARY

According to an exemplary embodiment of the inventive concept, a semiconductor memory device includes a first memory area in the semiconductor memory device, and a second memory area in the semiconductor memory device. The second memory area is accessed independently of the first memory area based on a usage selecting signal. The first and second memory areas share command and address lines, and perform a rank interleaving operation based on the usage selecting signal.

According to an exemplary embodiment of the inventive concept, a semiconductor memory device includes a first memory area in the semiconductor memory device, and a second memory area in the semiconductor memory device. The first and second memory areas selectively operate as two different semiconductor chips. The first and second memory areas receive a same command and address signal. The first memory area receives a first chip select signal, a first clock enable signal, and a first termination control signal. The second memory area receives a second chip select signal, a second clock enable signal, and a second termination control signal. The first chip select signal is different from the second chip select signal, the first clock enable signal is different from the second clock enable signal, and the first termination control signal is different from the second termination control signal. The first and second memory areas belong to and operate within a same rank or within different ranks based on a usage selecting signal.

According to an exemplary embodiment of the inventive concept, a memory module includes a substrate and a plurality of semiconductor memory devices mounted on the substrate. The semiconductor memory devices are spaced apart from one another on one side or opposite sides of the substrate. Each of the semiconductor memory devices includes a first bank group and a second bank group. The first bank group is formed of a first portion of the semiconductor memory device, and the second bank group is formed of a second portion of the semiconductor memory device. The first portion is different from the second portion, and the first and second bank groups are accessed independently of each other based on a usage selecting signal. The first and second bank groups share command and address lines and perform a rank interleaving operation based on the usage selecting signal.

According to an exemplary embodiment of the inventive concept, a data processing system includes a memory controller, a memory module, and a semiconductor memory device mounted on the memory module. The semiconductor memory device includes a first memory area and a second memory area. The data processing system further includes a first line connecting the memory controller to the memory module. A command and address signal is transmitted from the memory controller to the first and second memory areas via the first line. The data processing system further includes a second line connecting the memory controller to the memory module. A first chip select signal, a first clock enable signal, and a first termination control signal are transmitted from the memory controller to the first memory area via the second line. The data processing system further includes a third line connecting the memory controller to the memory module. A second chip select signal, a second clock enable signal, and a second termination control signal are transmitted from the memory controller to the second memory area via the third line. The first chip select signal is different from the second chip select signal, the first clock enable signal is different from the second clock enable signal, and the first termination control signal is different from the second termination control signal. The second memory area is accessed independently of the first memory area based on a usage selecting signal.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
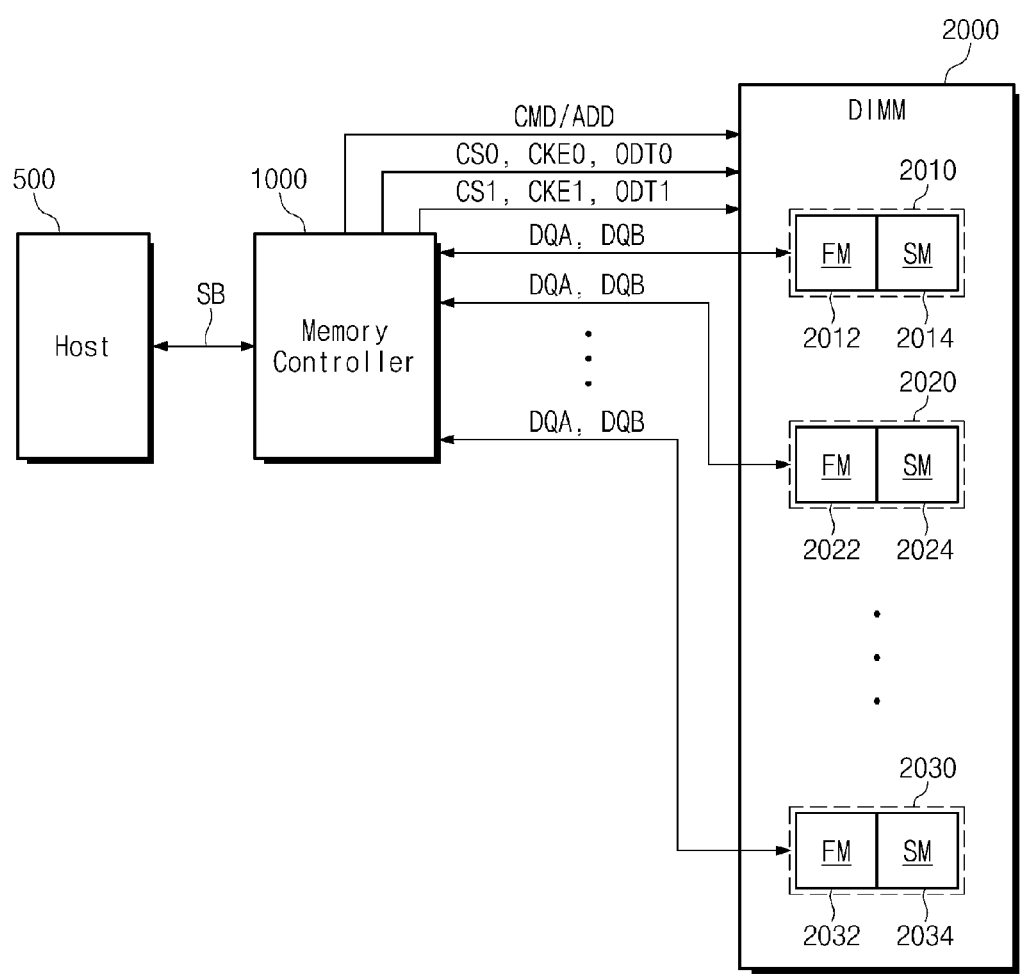
FIG. 1 is a block diagram of a data processing system that includes a memory module, according to an exemplary embodiment of the inventive concept.

Exemplary embodiments of the inventive concept will be described more fully hereinafter with reference to the accompanying drawings. Like reference numerals may refer to like elements throughout the accompanying drawings.

As will be described in further detail below, exemplary embodiments of the inventive concept provide a semiconductor memory device that is accessible as if two or more chips are accessed when the semiconductor memory device is mounted on a memory module in the form of single chip.

FIG. 1 is a block diagram of a data processing system that includes a memory module, according to an exemplary embodiment of the inventive concept.

Referring to FIG. 1, the data processing system may include a host 500, a memory controller 1000, and a memory module 2000.

The host 500 may be equipped with specific software that executes specific calculations or tasks, and may perform various computing functions. For example, the host 500 may be a microprocessor or a central processing unit. The host 500 may be coupled to the memory controller 1000 through a system bus SB. The system bus SB may include an address bus, a control bus, and/or a data bus.

The memory controller 1000 may access the memory module 2000. The memory controller 1000 may access a chip (e.g., a semiconductor memory device 2010) included in the memory module 2000 as if the chip is two distinct chips. In the exemplary embodiment shown in FIG. 1, the memory controller 1000 is separate from the host 500. However, the inventive concept is not limited thereto. For example, in an exemplary embodiment, the memory controller 1000 may be an internal memory controller IMC included in the host 500.

The memory module 2000 may be implemented in the form of a dual in-line memory module (DIMM). The memory module 2000 may include a plurality of semiconductor memory devices 2010, 2020, and 2030 that are mounted on a printed circuit board (PCB) substrate in the form of chip. According to an exemplary embodiment, one semiconductor memory device (e.g., 2010) may be implemented with a memory chip. Herein, the terms semiconductor memory device, chip, and die may be used interchangeably.

A semiconductor memory device (e.g., 2010) may include a first bank group 2012 formed in a portion thereof and a second bank group 2014 formed in a portion thereof. The first and second bank groups 2012 and 2014 are areas of memory (e.g., portions of memory blocks) of the semiconductor device (e.g., 2010) that are used to store data. The first bank group 2012 and the second bank group 2014 may be accessed independently of each other based on a usage selecting signal. That is, the first bank group 2012 (e.g., a first memory area) and the second bank group 2014 (e.g., a second memory area) may be accessed independently of each other in response to a usage selecting signal. For example, in exemplary embodiments, in response to the usage selecting signal, when the first bank group 2012 is accessed, the first bank group 2012 appears to be a single semiconductor memory device. Similarly, in response to the usage selecting signal, when the second bank group 2014 is accessed, the second bank group 2014 appears to be a single semiconductor memory device. The usage selecting signal may be applied to the semiconductor memory device as a mode register set signal. Alternatively, the usage selecting signal may be defined by a fuse option or a metal option as a control signal for an access operation.

The first bank group 2012 may correspond to a first memory area FM defined in a die (or a chip). The second bank group 2014 may correspond to a second memory area SM defined in the die. The second memory area SM may operate as a separate chip that is formed of the first memory area FM. Thus, even though the second memory area SM and the first memory area FM are implemented in the same die, the first and second memory areas FM and SM may be accessed as distinct chips by the memory controller 1000.

Each of the first and second bank groups 2012 and 2014 may include, for example, 8, 16, or 32 memory banks. A memory bank may include a plurality of memory blocks. The first and second bank groups 2012 and 2014 may share command and address lines, and may perform a rank interleaving operation based on the usage selecting signal (e.g., a signal SCS of FIG. 4). In an exemplary embodiment, the first and second bank groups 2012 and 2014 may receive a command and address signal CMD/ADD in a shared way. For example, the first and second bank groups 2012 and 2014 may commonly receive the command and address signal CMD/ADD via shared command and address lines. That is, in an exemplary embodiment, the command and address signal CMD/ADD may be received via the same command and address lines at the memory module 2000 and transmitted from the same command and address lines to the first and second bank groups 2012 and 2014. However, the first bank group 2012 may receive a chip select signal CS, a clock enable signal CKE, and a termination control signal ODT (also referred to as an on-die termination signal), and the second bank group 2014 may separately receive a chip select signal CS, a clock enable signal CKE, and a termination control signal ODT. For example, in exemplary embodiments, the first bank group 2012 may receive a chip select signal CS, a clock enable signal CKE, and a termination control signal ODT via first lines at the memory module 2000, and the second bank group 2014 may separately receive a chip select signal CS, a clock enable signal CKE, and a termination control signal ODT via second lines at the memory module 2000, which are different from the first lines. Thus, in exemplary embodiments, the first bank group 2012 (e.g., the first memory area) may receive a first chip select signal CS and the second bank group 2014 (e.g., the second memory area) may receive a second chip select signal CS different from the first chip select signal CS. Further, the first bank group 2012 (e.g., the first memory area) may receive a first termination control signal ODT and the second bank group 2014 (e.g., the second memory area) may receive a second termination control signal ODT that is different from the first termination control signal ODT. Further, the first bank group 2012 (e.g., the first memory area) may receive a first clock enable signal CKE and the second bank group 2014 (e.g., the second memory area) may receive a second clock enable signal CKE that is different from the first clock enable signal CKE.

Figure 4:
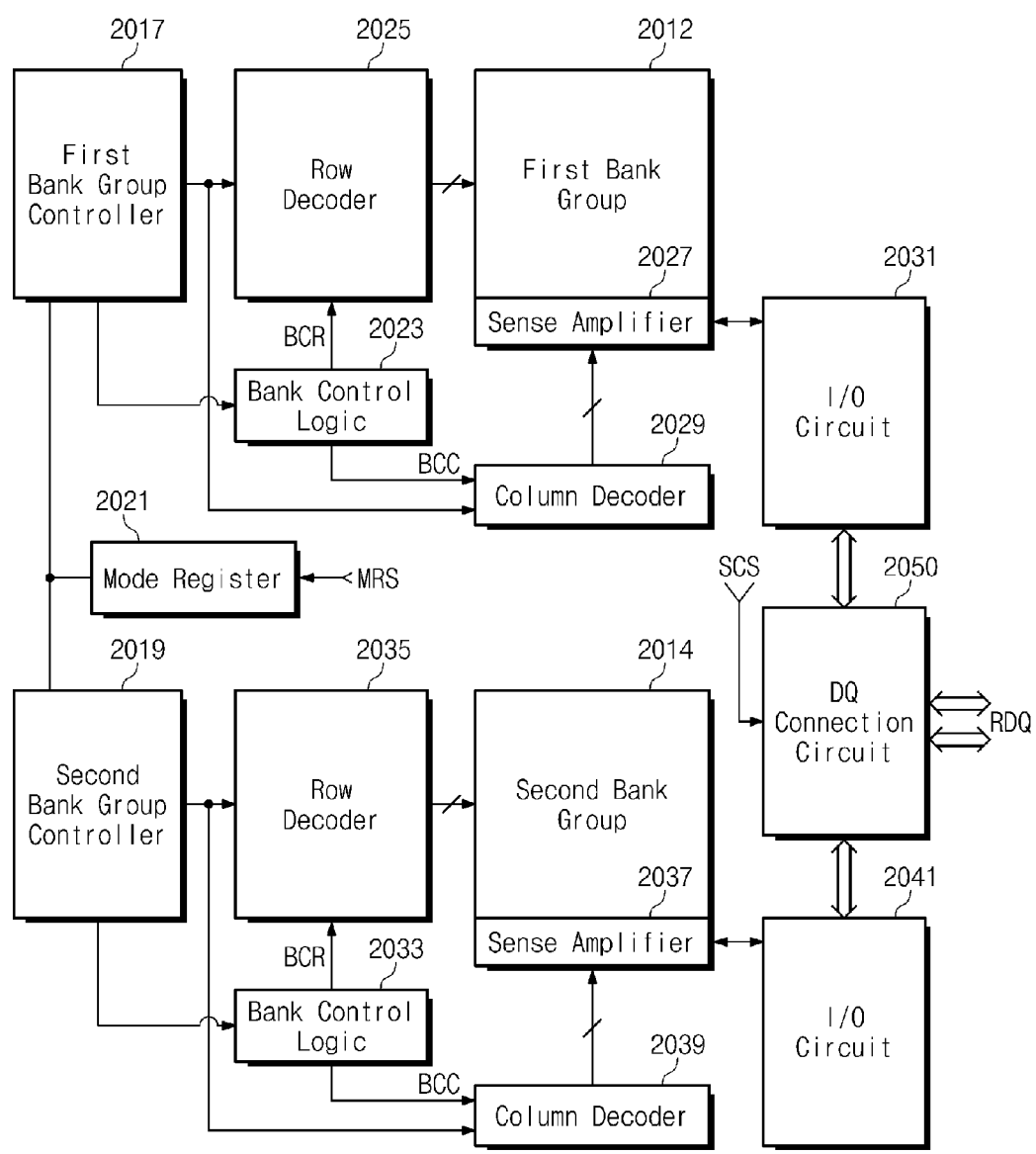
FIG. 4 is a detailed block diagram of the semiconductor memory device illustrated in FIG. 3, according to an exemplary embodiment of the inventive concept.

In operation, the first and second bank groups 2012 and 2014 may belong to and operate within the same rank or within different ranks based on the usage selecting signal (e.g., the signal SCS of FIG. 4). For example, when the first bank group 2012 belongs to and operates within a first rank, the second bank group 2014 may belong to and operate within a second rank. Generally, the term rank means that a plurality of semiconductor memory devices operate based on access. For example, when the semiconductor memory devices 2010, 2020, and 2030 illustrated in FIG. 1 are accessed concurrently, the semiconductor memory devices 2010, 2020, and 2030 may be referred to as belonging to the same rank. In exemplary embodiments, when the first bank group 2012 (e.g., the first memory area) and the second bank group 2014 (e.g., the second memory area) are accessed concurrently, the first and second bank groups 2012 and 2014 may be referred to as belonging to the same rank. When the first bank group 2012 (e.g., the first memory area) and the second bank group 2014 (e.g., the second memory area) are not accessed concurrently, the first and second bank groups 2012 and 2014 may be referred to as belonging to different ranks.

A DDR DRAM may be manufactured in the form of die or package. When the DDR DRAM has a capacity of 16 Gb (Gigabits), a 16 Gb DDR DRAM may be implemented with memory chips, each of which having a capacity of 8 Gb or 4 Gb, to increase flexibility of the memory module. In this case, the semiconductor memory device (e.g., 2010) having the memory capacity of 16 Gb may operate as two different memories, each of which has a memory capacity of 8 Gb in a die or in a package. Alternatively, the semiconductor memory device (e.g., 2010) having the memory capacity of 16 Gb may operate as four different memories, each of which has a memory capacity of 4 Gb in a die or in a package.

When a semiconductor memory device (e.g., 2010) having the memory capacity of 16 Gb operates as two memories each having a memory capacity of 8 Gb, the first and second memory areas FM and SM of the semiconductor memory device (e.g., 2010) included in the memory module 2000 may receive the command and address signal CMD/ADD from the memory controller 1000 in common.

Furthermore, the first memory area FM may receive a chip select signal CS0, a clock enable signal CKE0, and a termination control signal ODT0 via a first line(s), and the second memory area SM may receive a chip select signal CS1, a clock enable signal CKE1, and a termination control signal ODT1 via a second line(s) different from the first line(s). That is, the first memory area FM may receive the chip select signal CS0, the clock enable signal CKE0, and the termination control signal OTD0, and the second memory area SM may separately receive the chip select signal CS1, the clock enable signal CKE1, and the termination control signal OTD1. Further, data DQA may be independently exchanged between the memory controller 1000 and the first memory area FM, and data DQB may be independently exchanged between the memory controller 1000 and the second memory area SM.

Figure 2:
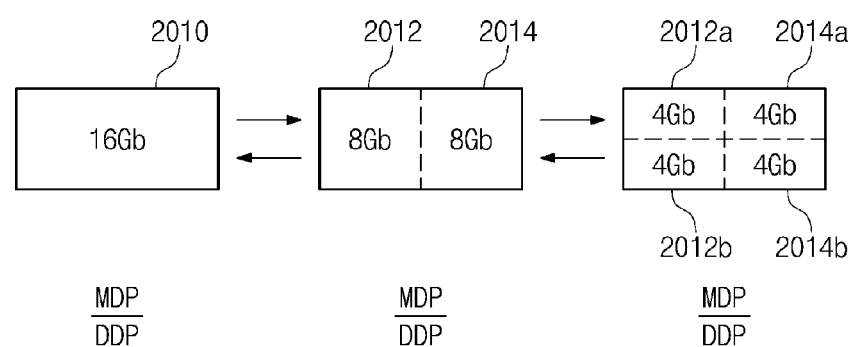
FIG. 2 is a diagram illustrating variations of a memory capacity of the semiconductor memory device of FIG. 1, according to exemplary embodiments of the inventive concept.

FIG. 2 is a diagram illustrating variations of a memory capacity of the semiconductor memory device of FIG. 1, according to exemplary embodiments of the inventive concept.

Referring to FIG. 2, the semiconductor memory device may be formed in a die or in a package. The semiconductor memory device may be, for example, a double data rate 4 (DDR4) DRAM. A semiconductor memory device may have, for example, a capacity of 16 Gb. The semiconductor memory device 2010 illustrated in FIG. 2 may be mounted on the memory module 2000 illustrated in FIG. 1. The semiconductor memory device, which is formed of a chip (or a die), may operate as the two bank groups 2012 and 2014, which are independently accessed according to an exemplary embodiment of the inventive concept. The bank group 2012 may operate as a memory chip, and the other bank group 2014 may operate as a memory chip that is independent of the bank group 2012.

Furthermore, the semiconductor memory device 2012 may operate as four bank groups 2012a, 2012b, 2014a, and 2014b, which are accessed independently of one another. When the semiconductor memory device 2010 operates as the two bank groups 2012 and 2014, each of the two bank groups 2012 and 2014 may have a memory capacity of 8 Gb. When the semiconductor memory device 2010 operates as the four bank groups 2012a, 2012b, 2014a, and 2014b, each of the four bank groups 2012a, 2012b, 2014a, and 2014b may have a memory capacity of 4 Gb.

The semiconductor memory device 2010 of FIG. 2 may be implemented with a mono die package (MDP). In this case, the two bank groups 2012 and 2014 or the four bank groups 2012a, 2012b, 2014a, and 2014b may be implemented with the MDP.

Furthermore, the semiconductor memory device 2010 may be implemented with a dual die package (DDP). In the DDP, a memory capacity of 16 Gb may be obtained by using two dies. In this case, the two bank groups 2012 and 2014 or the four bank groups 2012a, 2012b, 2014a, and 2014b may be implemented in the form of a DDP. When the semiconductor memory device 2010 is implemented with the DDP, a first die may be stacked on a second die. The first die may be electrically connected with the second die through a plurality of through-silicon vias (TSVs).

According to an exemplary embodiment of the inventive concept, the two bank groups 2012 and 2014 may belong to different ranks and may operate as two independent chips. Furthermore, the four bank groups 2012a, 2012b, 2014a, and 2014b may belong to different ranks and may operate as four independent chips. Furthermore, the semiconductor memory device 2010 may belong to one rank in operation. As such, a semiconductor memory device that is physically in the form of a single chip may be functionally used as two or more chips. Therefore, a rank interleaving operation according to an exemplary embodiment of the inventive concept may be implemented within the same chip. According to an exemplary embodiment of the inventive concept, the rank interleaving operation refers to one semiconductor memory device operating within the same rank or within different ranks. For example, in exemplary embodiments, the rank interleaving operation refers to semiconductor devices and memory areas of semiconductor devices being managed (e.g., based on the usage selecting signal) to operate within the same or different ranks, as described herein. The semiconductor memory device that is being operated within the same rank may operate within different ranks based on a state of the usage selecting signal.

Figure 3:
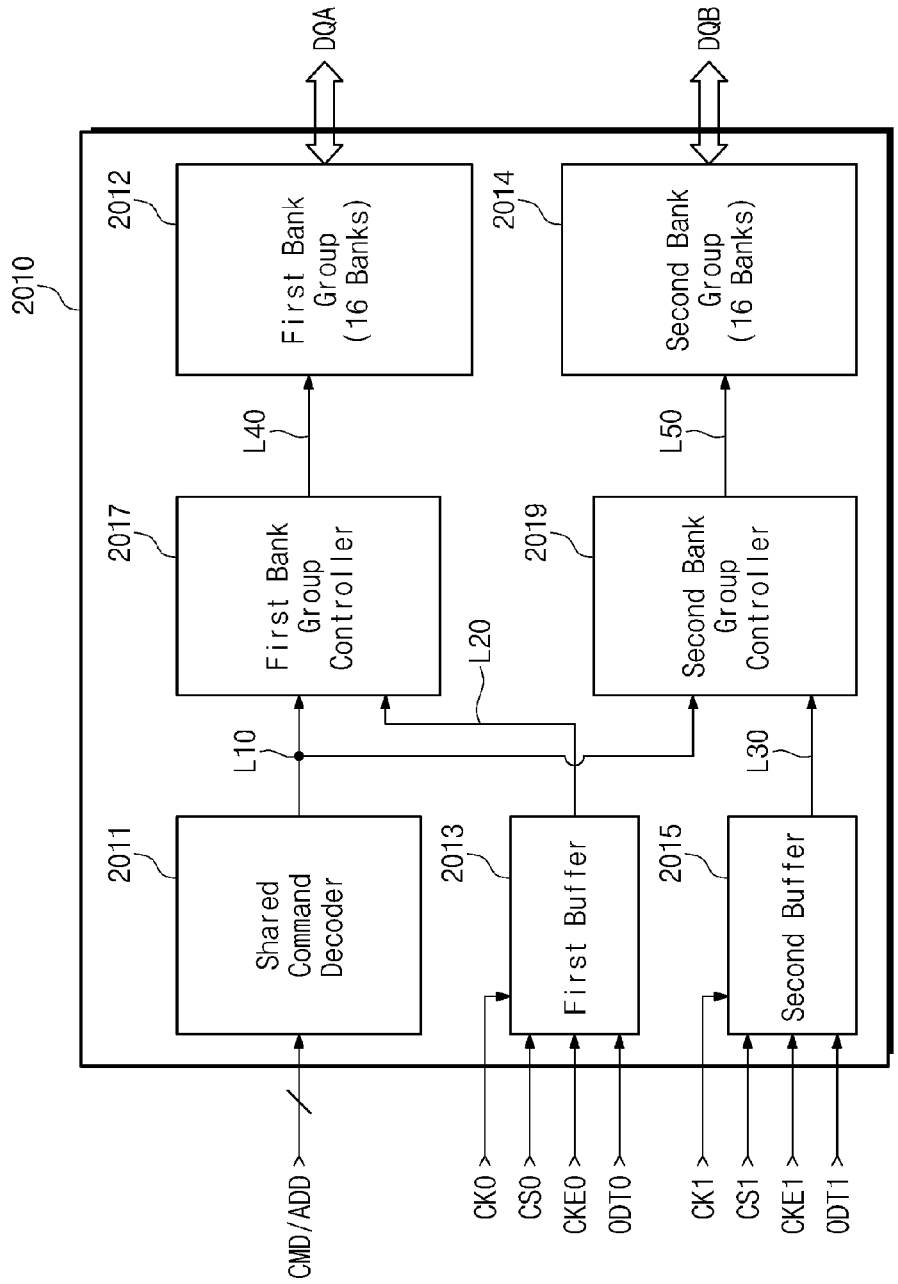
FIG. 3 is a block diagram of the semiconductor memory device illustrated in FIG. 1, according to an exemplary embodiment of the inventive concept.

FIG. 3 is a block diagram of the semiconductor memory device illustrated in FIG. 1, according to an exemplary embodiment of the inventive concept.

Referring to FIG. 3, the semiconductor memory device 2010 may include a shared command decoder 2011 (e.g., a shared command decoder circuit 2011), a first buffer 2013, a second buffer 2015, a first bank group controller 2017 (e.g., a first bank group controller circuit 2017), a second bank group controller 2019 (e.g., a second bank group controller circuit 2019), the first bank group 2012, and the second bank group 2014.

An exemplary embodiment is exemplified in FIG. 3 as one memory cell array divided into two. One segment of the memory cell array may be used as the first bank group 2012, and the other segment of the memory cell array may be used as the second bank group 2014.

The shared command decoder 2011 may decode command and address signals CMD/ADD applied through command and address lines. The decoding may be performed in common with respect to the first and second bank groups 2012 and 2014.

The fast buffer 2013 may receive and buffer the first chip select signal CS0, the first clock enable signal CKE0, and the first termination control signal ODT0. A first clock signal CK0 may be provided to the first buffer 2013.

The second buffer 2015 may receive and buffer the second chip select signal CS1, the second clock enable signal CKE1, and the second termination control signal ODT1. A second clock signal CK1 may be provided to the second buffer 2015.

The first bank group controller 2017 may receive decoded output signals of the shared command decoder 2011 through a line L10. The first bank group controller 2017 may receive the first chip select signal CS0, the first clock enable signal CKE0, and the first termination control signal ODT0, which are dedicated to the first bank group, through a line L20. The first bank group controller 2017 may control the first bank group 2012 through a line L40.

The second bank group controller 2019 may receive the decoded output signals of the shared command decoder 2011 through the line L10. The second bank group controller 2019 may receive the second chip select signal CS1, the second clock enable signal CKE1, and the second termination control signal ODT1, which are dedicated to the second bank group, through a line L30. The second bank group controller 2019 may control the second bank group 2014 through a line L50.

When each of the first and second bank groups 2012 and 2014 has a capacity of 16 Gb, each of the first and second bank groups 2012 and 2014 may be composed of 16 memory banks. Each of the first and second bank groups 2012 and 2014 may include a plurality of DRAM cells. One DRAM cell may include one access transistor and one storage capacitor.

In an exemplary embodiment, the first bank group 2012 may include DRAM cells, and the second bank group 2014 may include static random access memory (SRAM) cells. In this case, the SRAM cells may be implemented with extra sense amplifiers implemented during the manufacturing of a DRAM. The SRAM cells do not need a refresh operation, and read and write operations of the SRAM cells may be faster than those of the DRAM cells. Therefore, the SRAM may be used as a cache memory.

Furthermore, in an exemplary embodiment, the first bank group 2012 may include DRAM cells, and the second bank group 2014 may include nonvolatile memory cells, such as, for example, magnetic RAM (MRAM) cells, phase-change RAM (PRAM) cells, or flash memory cells.

Furthermore, in an exemplary embodiment, each of the first and second bank groups 2012 and 2014 may be implemented with nonvolatile memory cells.

When the first and second bank groups 2012 and 2014 belong to the same rank, the first bank group 2012 may be accessed through a first data channel DQA, and the second bank group 2014 may be accessed through a second data channel DQB independent of the first data channel DQA.

FIG. 4 is a detailed block diagram of the semiconductor memory device illustrated in FIG. 3, according to an exemplary embodiment of the inventive concept.

Referring to FIG. 4, the semiconductor memory device 2010 illustrated in FIG. 3 may include a mode register 2021. The mode register 2021 may be connected with the first and second bank group controllers 2017 and 2019 in common. The mode register 2021 may be a register that stores a mode register set (MRS) signal. In an exemplary embodiment, the mode register 2021 may store the usage selecting signal SCS for a rank interleaving operation.

A row decoder 2025 may be connected between the first bank group controller 2017 and the first bank group 2012. The row decoder 2025 may decode a row address and may output a row decoding signal for selecting a row of the first bank group 2012. The first bank group 2012 may be the first memory area FM.

A row decoder 2035 may be connected between the second bank group controller 2019 and the second bank group 2014. The row decoder 2035 may decode a row address and may output a row decoding signal for selecting a row of the second bank group 2014. The second bank group 2014 may be the second memory area SM.

Bank control logic 2023 (e.g., a bank control logic circuit 2023) may be connected to the first bank group controller 2017. The bank control logic 2023 may receive a bank address and may output a bank control row signal BCR and a bank control column signal BCC.

Bank control logic 2033 may be connected to the second bank group controller 2019. The bank control logic 2033 may receive a bank address and may output a bank control row signal BCR and a bank control column signal BCC.

A column decoder 2029 may be connected between the first bank group controller 2017 and the first bank group 2012. The column decoder 2029 may decode a column address and the bank control column signal BCC, and may output a column decoding signal for selecting a column of the first bank group 2012 that is the first memory area FM.

Column decoder 2039 may be connected between the second bank group controller 2019 and the second bank group 2014. The column decoder 2039 may decode a column address and the bank control column signal BCC, and may output a column decoding signal for selecting a column of the second bank group 2014 that is the second memory area SM.

Sense amplifiers 2027 connected to the first bank group 2012 may sense and amplify data read from the first bank group 2012, and may output the sensed and amplified data to an input/output (I/O) circuit 2031.

Sense amplifiers 2037 connected to the second bank group 2014 may sense and amplify data read from the second bank group 2014, and may output the sensed and amplified data to an input/output (I/O) circuit 2041.

A data communication (DQ) connection circuit 2050 may be connected between the I/O circuits 2031 and 2041. The DQ connection circuit 2050 may control data input/output paths based on a rank interleaving operation of the first and second memory areas FM and SM. When the first and second memory areas FM and SM belong to the same rank, the input/output paths of the I/O circuits 2031 and 2041 may be separate from each other at an output stage. When the first and second memory areas FM and SM belong to different ranks, the input/output paths of the I/O circuits 2031 and 2041 may be integrated at the output stage.

The DQ connection circuit 2050 may receive the usage selecting signal SCS and may control the data input/output paths based on the received usage selecting signal SCS. The usage selecting signal SCS may be provided from the first and second bank group controllers 2017 and 2019 or may be directly provided from the mode register 2021.

Figure 5:
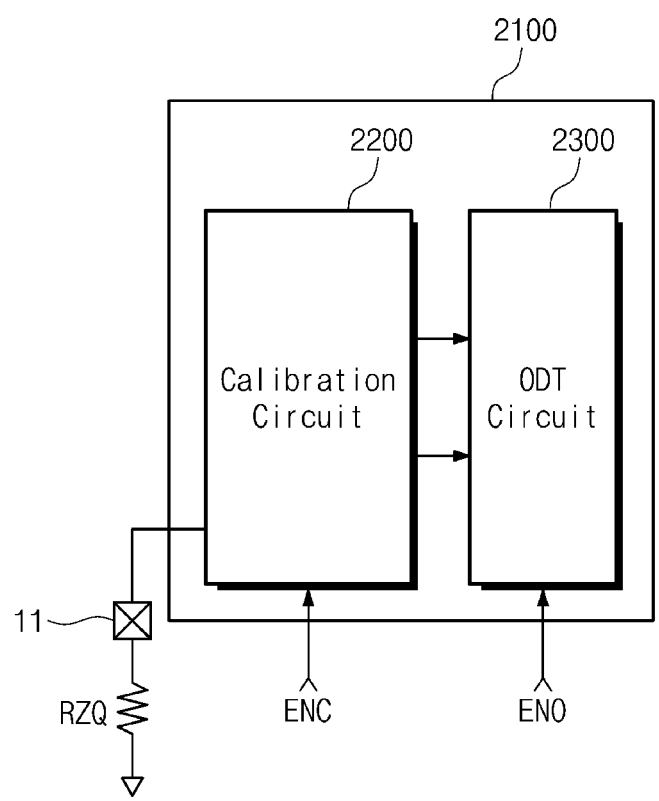
FIG. 5 is a block diagram of an on-die termination (ODT) circuit block included in the semiconductor memory device illustrated in FIG. 3, according to an exemplary embodiment of the inventive concept.

FIG. 5 is a block diagram of an on-die termination (ODT) circuit block included in the semiconductor memory device illustrated in FIG. 3, according to an exemplary embodiment of the inventive concept.

The circuit block illustrated in FIG. 5 may be implemented in each of the first and second bank group controllers 2017 and 2019 illustrated in FIG. 3 for an independent on-die termination operation.

Referring to FIG. 5, an on-die termination (ODT) circuit block 2100 may include a calibration circuit 2200 and an ODT circuit 2300.

A ZQ pad 11 may be connected to the calibration circuit 2200, and a ZQ resistor RZQ (e.g., an external resistor) may be connected to the ZQ pad 11. That is, the ZQ resistor RZQ may be a resistor connected at the outside of the semiconductor memory device. A resistance value of the ZQ resistor RZQ may be, for example, about 240 ohms. However, the resistance value of the ZQ resistor RZQ is not limited thereto.

The calibration circuit 2200 may perform calibration in response to a calibration enable signal ENC.

The ODT circuit 2300 may perform an ODT operation in response to an ODT enable signal ENO.

In FIG. 1, when the first and second termination control signals ODT0 and ODT1 are applied to the semiconductor memory device 2010, the ODT operations of the first and second memory areas FM and SM may be independently performed.

Certain benefits resulting from the ODT operations of the first and second memory areas FM and SM being independently performed are described below.

Signals transmitted through a transmission line may be reflected from a termination of the transmission line. Since the reflected signals affect an original signal, signal integrity (SI) may be deteriorated.

To protect the reflection of a signal, a termination resistor may be connected to a termination node of a transmission line. The termination resistor may be used for impedance matching between an external device and each memory area of the semiconductor memory device. The termination resistor may be used in the DRAM that operates at high speed. To prevent signal interference among DRAMs, an ODT technology that connects a termination resistor to a DRAM die may be used. Since the operating speed of DDR4 synchronous DRAM (SDRAM) is several thousand MHz or more, greater signal integrity and reliability is desirable. A value of the termination resistor may be changed according to a manufacturing process, a power supply voltage, and an operating temperature. Therefore, if the impedance is not precisely matched, it may be difficult to transmit a signal at high speed and a signal may be distorted.

To obtain greater signal quality and reliability, in exemplary embodiments, the DDR4 SDRAM may use a ZQ calibration circuit. When a value of a termination resistor is accurately corrected according to a calibration code that the ZQ calibration circuit generates, impedance may be properly matched in a memory system.

The ODT circuit block 2100 may be a termination matching circuit included in the semiconductor memory device. According to an exemplary embodiment of the inventive concept, the ODT circuit block 2100 may be connected to a DQ pin or a DQ port of the semiconductor memory device. The ODT may be implemented in the ODT circuit block 2100 in other termination methods.

Figure 6:
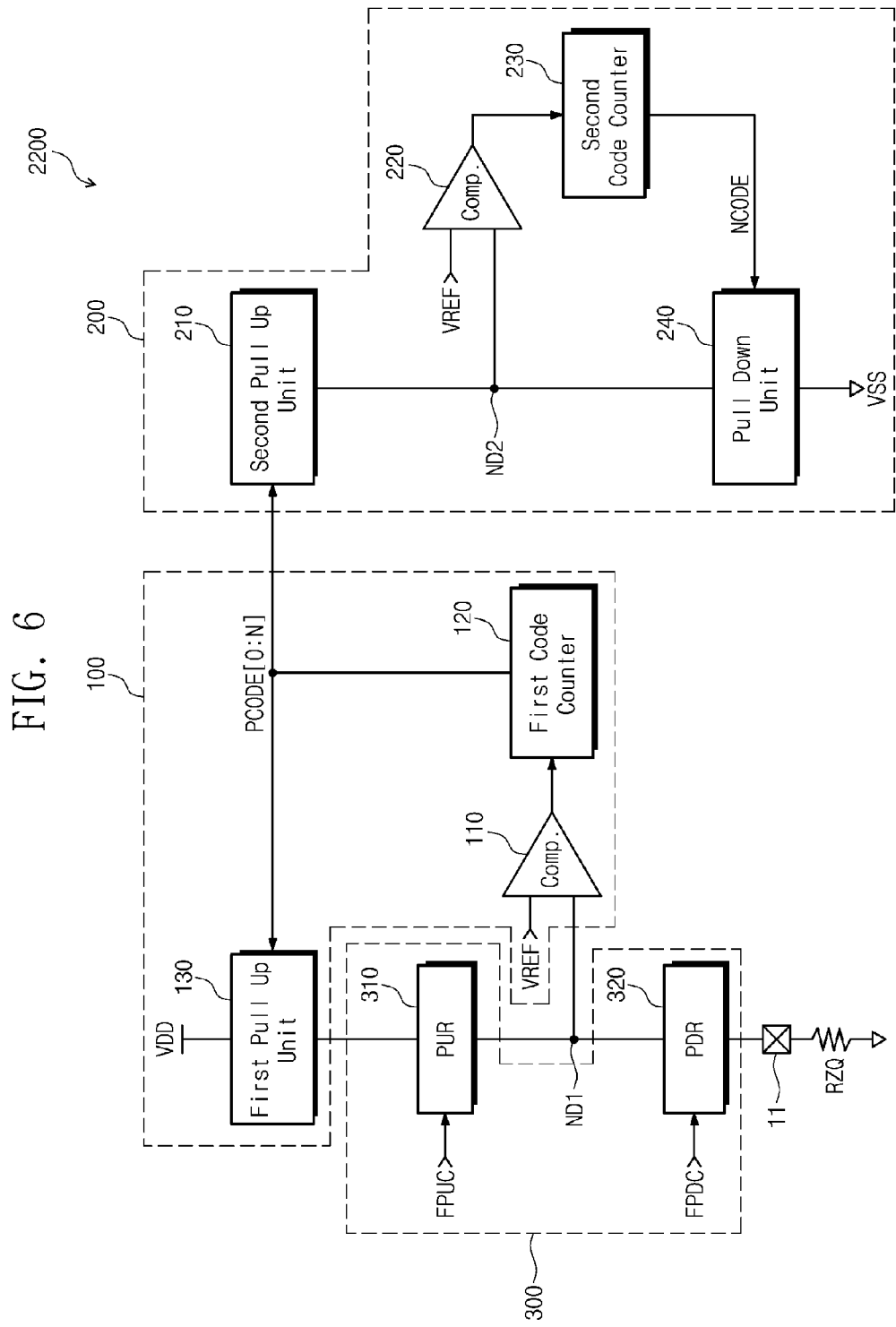
FIG. 6 is a detailed diagram of a calibration circuit included in the ODT circuit block of FIG. 5, according to an exemplary embodiment of the inventive concept.

FIG. 6 is a detailed diagram of a calibration circuit included in the ODT circuit block of FIG. 5, according to an exemplary embodiment of the inventive concept.

Referring to FIG. 6, the calibration circuit 2200 may include a pull-up calibration code generating unit 100, a pull-down calibration code generating unit 200, and a ZQ fine tuning unit 300.

The pull-up calibration code generating unit 100 may include a first pull-up unit 130, a first comparison unit 110 (also referred to as a first comparator 110), and a first code counter 120 (also referred to as a first code counter 120).

The pull-down calibration code generating unit 200 may include a second pull-up unit 210, a second comparison unit 220 (also referred to as a second comparator 220), a second code counter 230 (also referred to as a second code counter 230), and a pull-down unit 240.

The ZQ fine tuning unit 300 may include a variable pull-up resistor 310 and a variable pull-down resistor 320. The variable pull-up resistor 310 and the variable pull-down resistor 320 may be connected to a first calibration node ND1. The first calibration node ND1 may be an input terminal of the first comparison unit 110.

A final pull-up control signal FPUC may be used to adjust a resistance value of the variable pull-up resistor 310. A final pull-down control signal FPDC may be used to adjust a resistance value of the variable pull-down resistor 320.

When the resistance values of the variable pull-up resistor 310 and the variable pull-down resistor 320 are adjusted, a voltage level of the first calibration node ND1 may be changed.

Once a ZQ calibration operation is performed, the memory controller 1000 may determine the final pull-up control signal FPUC or the final pull-down control signal FPDC based on signal loading characteristics of a memory module or a rank, so as to be suitable for a system environment. Accordingly, the resistance value of the ZQ resistor RZQ may be fine-tuned to meet the signal loading characteristics of a memory slot, a memory module, or a rank mounted on a circuit board.

ZQ calibration may be a process of generating an impedance code. The impedance code may be changed as a process, voltage, and temperature (PVT) are changed. The impedance code generated through the ZQ calibration may be used to adjust a resistance value of a termination resistor. Since a pad to which an external resistor is connected is referred to as a ZQ pad, the term ZQ calibration is used. The external resistor may be used as a reference resistor for calibration.

When the ZQ fine tuning unit 300 is in an initial state (e.g., when the ZQ fine tuning unit 300 has not yet performed fine adjustment), the first comparison unit 110 may receive a voltage from the first calibration node ND1. The voltage of the first calibration node ND1 may be generated using the ZQ resistor RZQ connected to the ZQ pad 11 and the first pull-up unit 130. The first comparison unit 110 may compare the voltage of the first calibration node ND1 with a reference voltage VREF (e.g., VDD/2) and may generate an up/down signal UP/DN based on the comparison result.

The first code counter 120 may generate a pull-up calibration code PCODE having (N+1) bits in response to the up/down signal UP/DN (e.g., the comparison result of the first comparison unit 110). Here, N is a natural number equal to at least 1. Parallel resistors of the first pull-up unit 130 may be turned on/off by the pull-up calibration code PCODE (resistance values of the parallel resistors are designed to have a binary weight), and thus, a resistance value of the first pull-up unit 130 may be adjusted. The adjusted resistance value of the first pull-up unit 130 may affect a voltage value of the first calibration node ND1, and the first comparison unit 110 may repeat the above-described operation. Thus, the pull-up calibration operation may be repeated until the resistance value of the first pull-up unit 130 is equal to the resistance value of the ZQ resistor RZQ.

The pull-up calibration code PCODE generated by the pull-up calibration operation may be provided to the second pull-up unit 210. A total resistance value of the second pull-up unit 210 may be determined based on the pull-up calibration code PCODE. A pull-down calibration operation may start. The second comparison unit 220 may receive a voltage generated by the second pull-up unit 210 and the pull-down unit 240 through a second calibration node ND2. The second comparison unit 220 may compare a voltage of the second calibration node ND2 with a reference voltage VREF and may generate an up/down signal UP/DN based on the comparison result.

The second code counter 230 may generate a pull-down calibration code NCODE having (N+1) bits based on the up/down signal UP/DN (e.g., the comparison result of the second comparison unit 220). Parallel resistors of the pull-down unit 240 may be turned on/off by the pull-down calibration code NCODE such that a resistance value of the pull-down unit 240 is adjusted. The adjusted resistance value of the pull-down unit 240 may affect a voltage value of the second calibration node ND2, and the second comparison unit 220 may repeat the above-described operation. Thus, the pull-down calibration operation may be repeatedly performed until the resistance value of the second pull-up unit 210 is equal to the resistance value of the pull-down unit 240. When the pull-down calibration operation is completed, the voltage of the second calibration node ND2 may be equal to the reference voltage VREF.

When the above-described pull-up and pull-down calibration operations are completed, the pull-up calibration code PCODE and the pull-down calibration code NCODE may be provided to the memory controller 1000. The memory controller 1000 may determine a final calibration value based on signal loading characteristics of a memory slot, a memory module, or a rank mounted on a circuit board.

The final pull-up control signal FPUC and the final pull-down control signal FPDC may be generated by the memory controller 1000. As a result, when the ZQ calibration is performed, a difference of signal loading characteristics may be applied in performing the ZQ calibration, and thus, the ZQ calibration may be accurately performed. It is to be understood that the calibration circuit 2200 as described with reference to FIG. 6 is exemplary, and that the calibration circuit 2200 according to exemplary embodiments of the inventive concept is not limited thereto.

Figure 7:
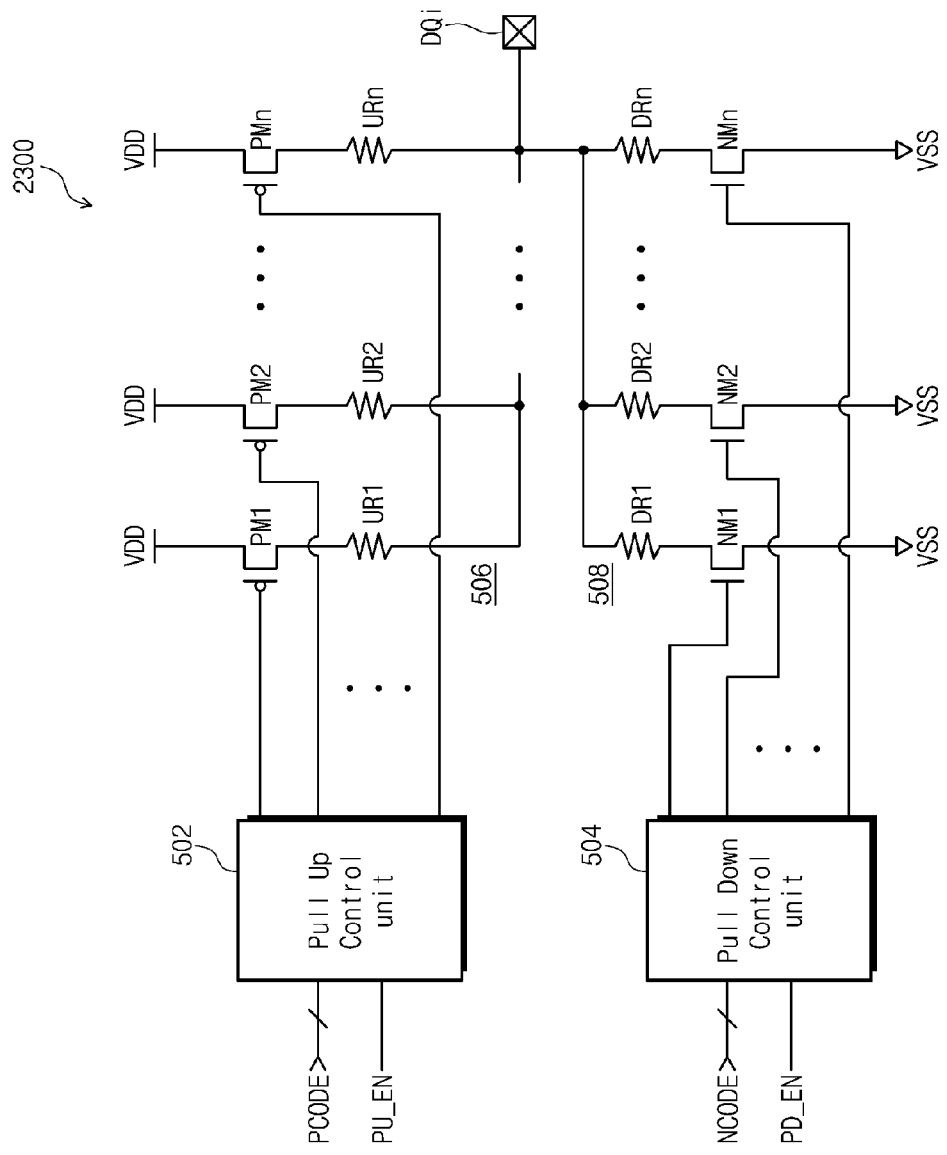
FIG. 7 is a detailed diagram of the ODT circuit included in the ODT circuit block of FIG. 5, according to an exemplary embodiment of the inventive concept.

FIG. 7 is a detailed diagram of the ODT circuit 2300 included in the ODT circuit block 2100 of FIG. 5, according to an exemplary embodiment of the inventive concept.

Referring to FIG. 7, the ODT circuit 2300 may include a pull-up control unit 502, a pull-down control unit 504, a pull-up termination unit 506, and a pull-down termination unit 508.

The ODT circuit 2300 may terminate an impedance of a DQ pad DQi in response to the pull-up and pull-down calibration codes PCODE and NCODE generated by the calibration circuit 2200.

A configuration of the pull-up termination unit 506 may be similar to that of the first pull-up unit 130 of FIG. 6. Since a resistance value of the pull-up termination unit 506 is determined based on the pull-up calibration code PCODE, the pull-up termination unit 506 and the first pull-up unit 130 may be designed similarly. An operation of the pull-up termination unit 506 is described below.

The pull-up control unit 502 may control the pull-up termination unit 506 in response to the pull-up calibration code PCODE and a pull-up enable signal PU_EN. The pull-up enable signal PU_EN may be used to turn on/off the pull-up termination unit 506. When the pull-up enable signal PU_EN is activated, resistors UR1 to URn of the pull-up termination unit 506, which are connected to transistors PM1 to PMn, may be turned on/off based on the pull-up calibration code PCODE. In the exemplary embodiment of FIG. 7, n is a natural number equal to at least 3. However, the number of resistors and transistors of the pull-up termination unit 506 is not limited to the exemplary embodiment of FIG. 7. For example, in exemplary embodiments, the pull-up termination unit 506 may include only UR1 and PM1, or only UR1, PM1, UR2 and PM2. When the pull-up enable signal PU_EN is not activated, the pull-up termination unit 506 does not operate, regardless of the pull-up calibration code PCODE. That is, all of the resistors UR1 to URn of the pull-up termination unit 506 are turned off when the pull-up enable signal PU_EN is not activated.

A configuration of the pull-down termination unit 508 may be similar to that of the pull-down unit 240 of FIG. 6. Since a resistance value of the pull-down termination unit 508 is determined based on the pull-down calibration code NCODE, the pull-down termination unit 508 and the pull-down unit 240 may be designed similarly. An operation of the pull-down termination unit 508 is described below.

The pull-down control unit 504 may control the pull-down termination unit 508 in response to the pull-down calibration code NCODE and a pull-down enable signal PD_EN. The pull-down enable signal PD_EN may be used to turn on/off the pull-down termination unit 508. When the pull-down enable signal PD_EN is activated, resistors DR1 to DRn of the pull-down termination unit 508, which are connected to transistors NM1 to NMn, may be turned on/off based on the pull-down calibration code NCODE. In the exemplary embodiment of FIG. 7, n is a natural number equal to at least 3. However, the number of resistors and transistors of the pull-down termination unit 508 is not limited to the exemplary embodiment of FIG. 7. For example, in exemplary embodiments, the pull-down termination unit 508 may include only DR1 and NM1, or only DR1, NM1, DR2 and NM2. When the pull-down enable signal PD_EN is not activated, the pull-down termination unit 508 does not operate, regardless of the pull-down calibration code NCODE. That is, all of the resistors DR1 to DRn of the pull-down termination unit 508 are turned off when the pull-down enable signal PD_EN is not activated.

When the pull-up termination unit 506 is activated based on the pull-up enable signal PU_EN, the pull-up termination unit 506 may set a level of the DQ pad DQi to a high level. In this case, data of the high level may be outputted through the DQ pad DQi. When the pull-down termination unit 508 is activated based on the pull-down enable signal PD_EN, the pull-down termination unit 508 may set the level of the DQ pad DQi to a low level. In this case, data of the low level may be outputted through the DQ pad DQi.

As described above, the above-described ODT operations of the first and second memory areas FM and SM of FIG. 1 may be independent of each other.

According to exemplary embodiments of the inventive concept, the ODT may be performed in a center tap termination (CTT) method. It is to be understood that the ODT circuit 2300 as described with reference to FIG. 7 is exemplary, and that the ODT circuit 2300 according to exemplary embodiments of the inventive concept is not limited thereto.

Figure 8:
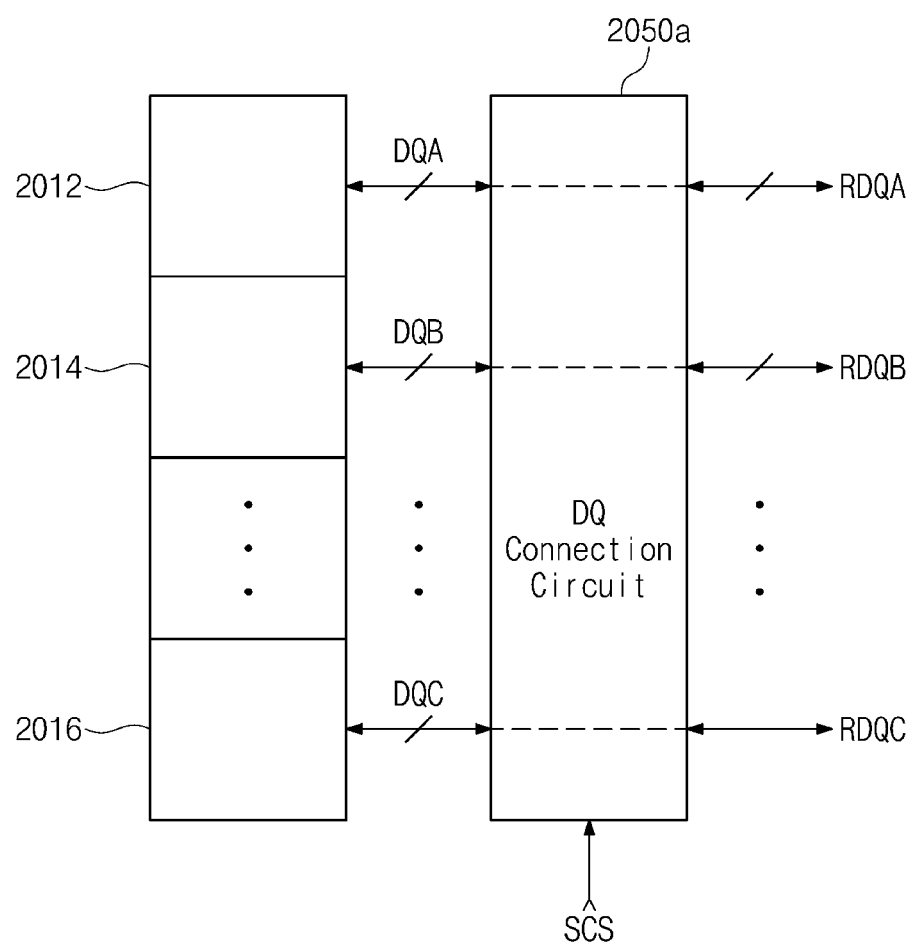
FIG. 8 is a diagram illustrating an operation of the data communication (DQ) connection circuit that is connected to input/output circuits of FIG. 4, according to an exemplary embodiment of the inventive concept.

FIG. 8 is a diagram illustrating an operation of the DQ connection circuit that is connected to the input/output circuits of FIG. 4, according to an exemplary embodiment of the inventive concept.

Referring to FIG. 8, first to kth memory areas 2012, 2014, and 2016 may belong to the same rank in a semiconductor memory module. For convenience of description, it may be assumed that k is 3. However, k is not limited thereto. In this case, first to kth input/output terminals DQA, DQB, and DQC may be respectively connected with input/output terminals RDQA, RDQB, and RDQC of a chip by adjusting input/output paths of a DQ connection circuit 2050a. The first to kth input/output terminals DQA, DQB, and DQC may be terminals that output data corresponding to the first to kth memory areas 2012, 2014, and 2016, respectively. When the first to kth memory areas 2012, 2014, and 2016 belong to the same rank in the semiconductor memory module, the input/output paths may be independent of each other. As illustrated in FIG. 8, the DQ connection circuit 2050a may connect the first to kth input/output terminals DQA, DQB, and DQC to the input/output terminals RDQA, RDQB, and RDQC of the chip, respectively, in response to the usage selecting signal SCS.

According to exemplary embodiments, when the first input/output terminal DQA transmits 8 bits of data, the number of the first input/output terminals RDQA of the chip is 8. When the second input/output terminal DQB transmits 16 bits of data, the number of the second input/output terminals RDQB of the chip is 16.

Figure 9:
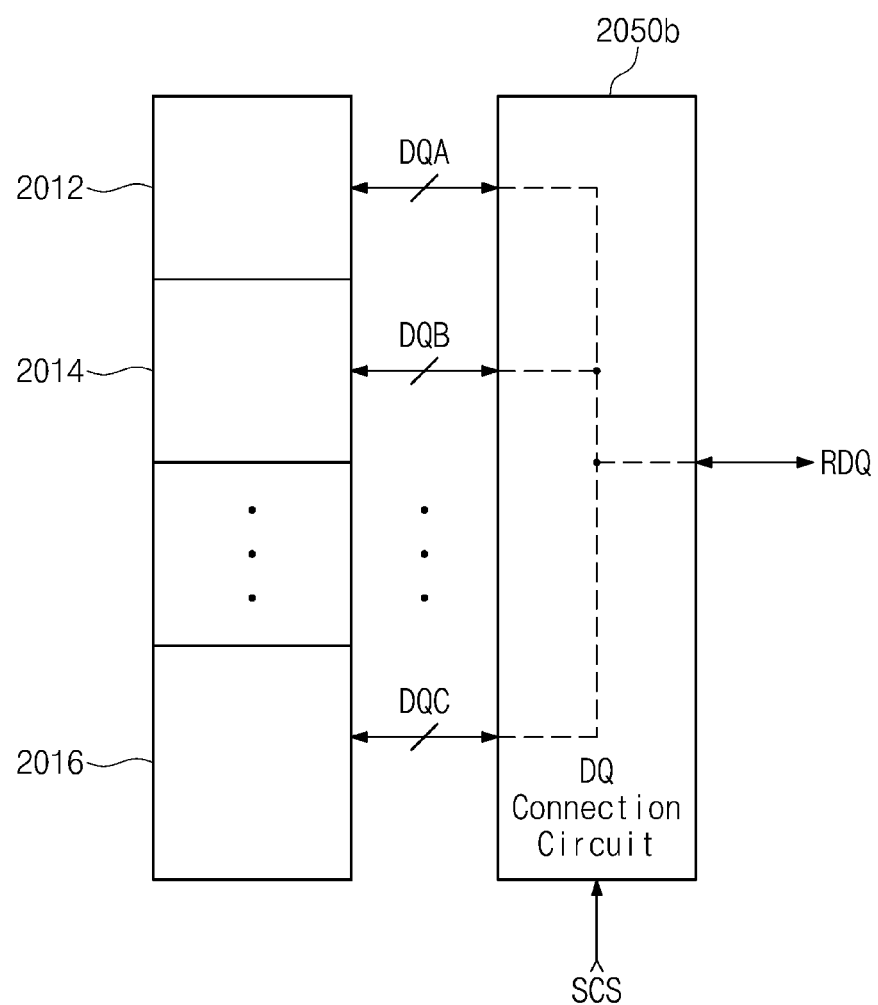
FIG. 9 is a diagram illustrating another operation of the DQ connection circuit that is connected to the input/output circuits of FIG. 4, according to an exemplary embodiment of the inventive concept.

FIG. 9 is a diagram illustrating another operation of the DQ connection circuit that is connected to the input/output circuits of FIG. 4, according to an exemplary embodiment of the inventive concept.

Referring to FIG. 9, the first to kth memory areas 2012, 2014, and 2016 may belong to different ranks in a semiconductor memory module. For convenience of description, it may be assumed that k is 3. However, k is not limited thereto. In this case, the first to kth input/output terminals DQA, DQB, and DQC may be connected with an input/output terminal RDQ of a chip in common by adjusting input/output paths of a DQ connection circuit 2050b. The first to kth input/output terminals DQA, DQB, and DQC may be terminals that output data corresponding to the first to kth memory areas 2012, 2014, and 2016, respectively. When the first to kth memory areas 2012, 2014, and 2016 belong to the different ranks in the semiconductor memory module, the input/output paths may be integrated. That is, the input/output terminal RDQ of the chip may be used in common for the first to kth memory areas 2012, 2014, and 2016.

As illustrated in FIG. 9, the DQ connection circuit 2050b may connect the first to kth input/output terminals DQA, DQB, and DQC to the input/output terminal RDQ of the chip in common in response to the usage selecting signal SCS.

For example, in an exemplary embodiment, when the first input/output terminal DQA transmits 8 bits of data, and the second input/output terminal DQB transmits 16 bits of data, the number of the input/output terminals RDQ is 16.

Figure 10:
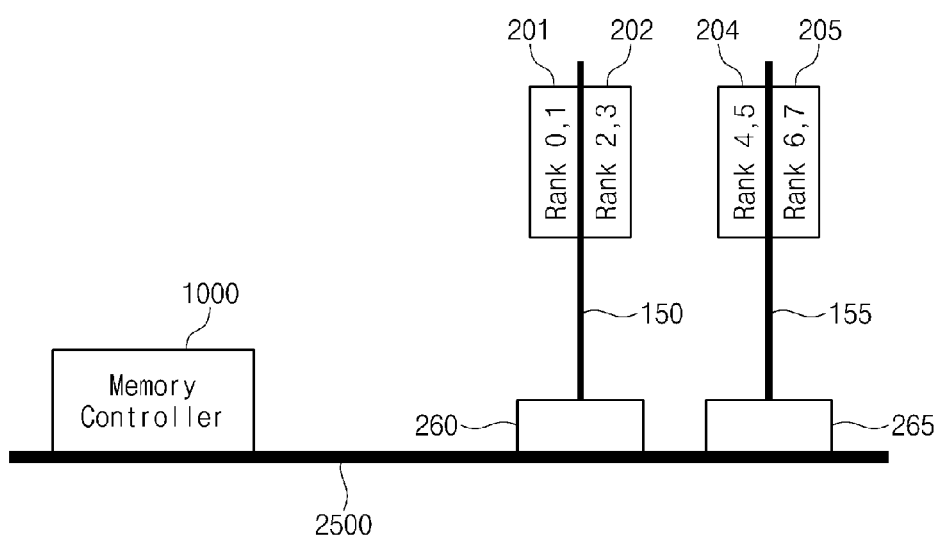
FIG. 10 is a block diagram of a memory system that includes a plurality of memory modules, according to an exemplary embodiment of the inventive concept.

FIG. 10 is a block diagram of a memory system that includes a plurality of memory modules, according to an exemplary embodiment of the inventive concept.

Referring to FIG. 10, the memory controller 1000 may be connected with memory slots 260 and 265 through a bus 2500. Memory modules 150 and 155 may include a plurality of ranks 201, 202, 204, and 205. Each of the memory modules 150 and 155 may be, for example, the DIMM 2000 according to the exemplary embodiments described above. Each of a plurality of ranks may include a plurality of semiconductor memory devices. According to an exemplary embodiment of the inventive concept, one rank (e.g., 201) may be divided into two ranks Rank0 and Rank1, which operate independently of each other, allowing a semiconductor memory device that is implemented with one chip to perform a rank interleaving operation. Another rank (e.g., 202) in the memory module 150 may be divided into two ranks Rank2 and Rank3, which operate independently of each other. Similarly, a rank (e.g., 204) in the memory module 155 may be divided into two ranks Rank4 and Rank5, and another rank (e.g., 205) in the memory module 155 may be divided into two ranks Rank6 and Rank7.

Figure 11:
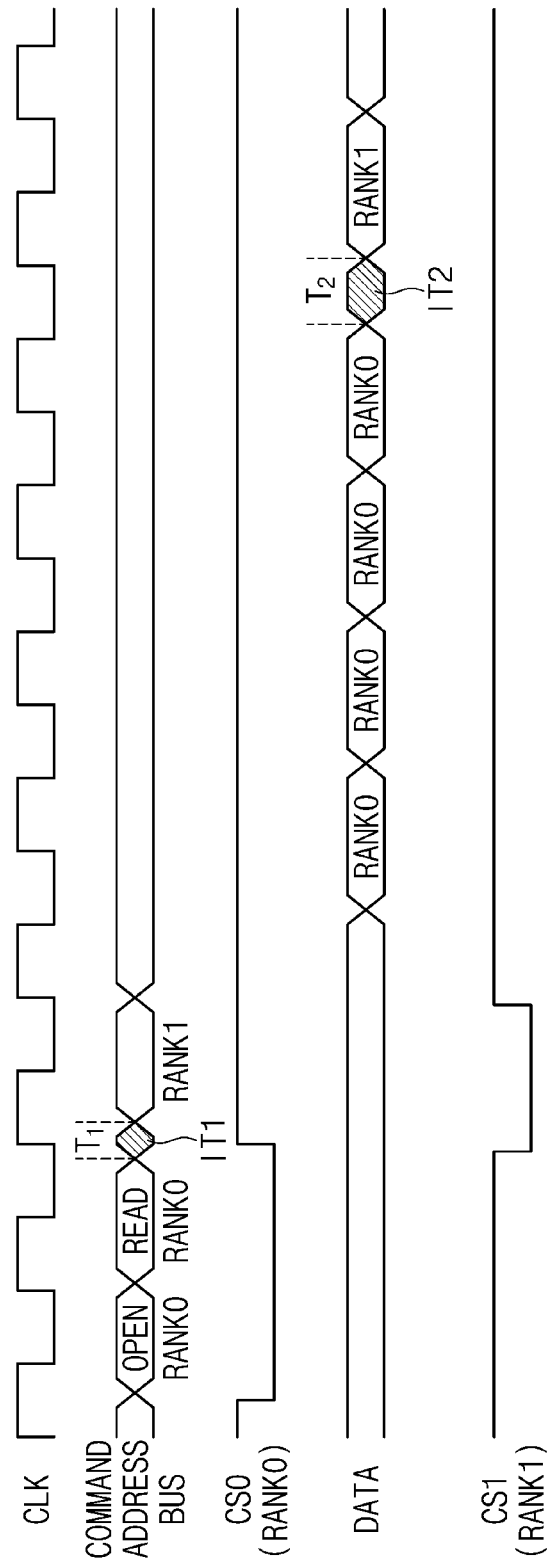
FIG. 11 is a timing diagram of an operation of a memory system illustrated in FIG. 10, according to an exemplary embodiment of the inventive concept.

FIG. 11 is a timing diagram of an operation of a memory system illustrated in FIG. 10, according to an exemplary embodiment of the inventive concept.

Referring to FIG. 11, command and address signals may be applied to the semiconductor memory device 2010 through a command address bus in synchronization with a clock CLK. When the chip select signal CS0 for selecting a first rank RANK0 and the chip select signal CS1 for selecting a second rank RANK1 are applied to the semiconductor memory device 2010 at different points of time, the first and second bank groups 2012 and 2014 of the semiconductor memory device 2010 may belong to and operate within different ranks. As illustrated in FIG. 11, two data sets may be outputted. For example, data outputted from the first rank RANK0 and data outputted from the second rank RANK1 may be outputted.

In FIG. 11, a period T1 indicates an invalid period for distinguishing command signals for respective ranks, and a period 12 indicates an invalid period for distinguishing data for respective ranks. The periods T1 and T2 as illustrated are for convenience of description, and exemplary embodiments of the inventive concept are not limited thereto.

Figure 12:
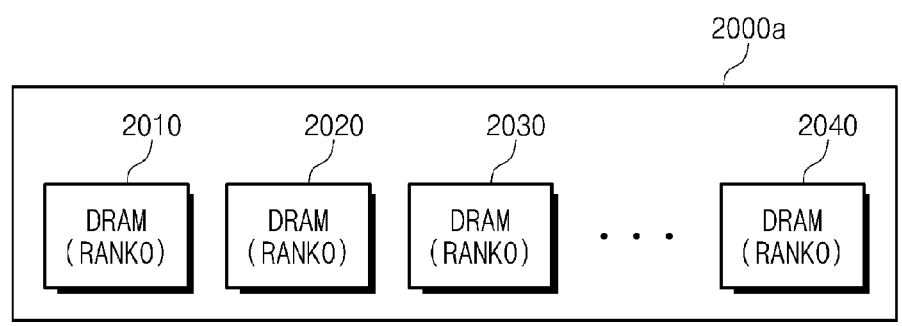
FIG. 12 is a drawing illustrating a memory module forming a single rank on one side of a dual in-line memory module (DIMM), according to an exemplary embodiment of the inventive concept.

FIG. 12 is a drawing illustrating a memory module forming a single rank on one side of a DIMM, according to an exemplary embodiment of the inventive concept.

Referring to FIG. 12, a plurality of semiconductor memory devices 2010, 2020, 2030, and 2040 are mounted on one side of a DIMM 2000a. Each of the plurality of semiconductor memory devices 2010, 2020, 2030, and 2040 may be, for example, a DRAM. When a rank interleaving operation is not performed, the plurality of semiconductor memory devices 2010, 2020, 2030, and 2040 may constitute a single rank. That is, the plurality of semiconductor memory devices 2010, 2020, 2030, and 2040 may operate within a first rank RANK0.

Figure 13:
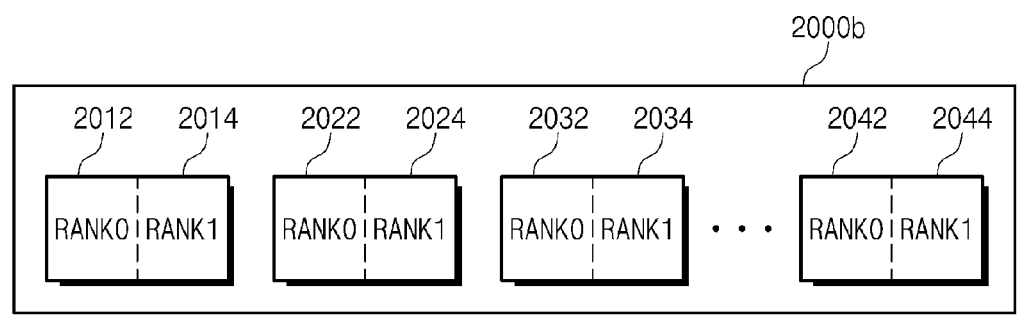
FIG. 13 is a drawing illustrating a memory module that includes chips mounted on one side of a DIMM that operate as a dual rank, according to an exemplary embodiment of the inventive concept.

FIG. 13 is a drawing illustrating a memory module that includes chips mounted on one side of a DIMM that operate as a dual rank, according to an exemplary embodiment of the inventive concept.

Referring to FIG. 13, the plurality of bank groups 2012, 2014, 2022, 2024, 2032, 2034, 2042, and 2044 are mounted on one side of a DIMM 2000b. Here, the two bank groups 2012 and 2014 may be implemented with one memory die (or one memory chip). That is, according to an exemplary embodiment of the inventive concept, the semiconductor memory device 2010 of FIG. 12 may be divided into two bank groups. Each of the two bank groups may be independently accessed. For example, in an exemplary embodiment, each of the two bank groups may be independently accessed as if they were separate memory chips. In this case, a total memory capacity of the two bank groups may be equal to the memory capacity of the semiconductor memory device 2010 of FIG. 12.

As a result, when a rank interleaving operation is performed, the plurality of bank groups 2012, 2014, 2022, 2024, 2032, 2034, 2042, and 2044 may operate within a dual-rank. That is, a plurality of bank groups 2012, 2022, 2032, and 2042 of the plurality of bank groups 2012, 2014, 2022, 2024, 2032, 2034, 2042, and 2044 may belong to a first rank RANK0. Further, a plurality of bank groups 2014, 2024, 2034, and 2044 of the plurality of bank groups 2012, 2014, 2022, 2024, 2032, 2034, 2042, and 2044 may belong to a second rank RANK1.

Figure 14:
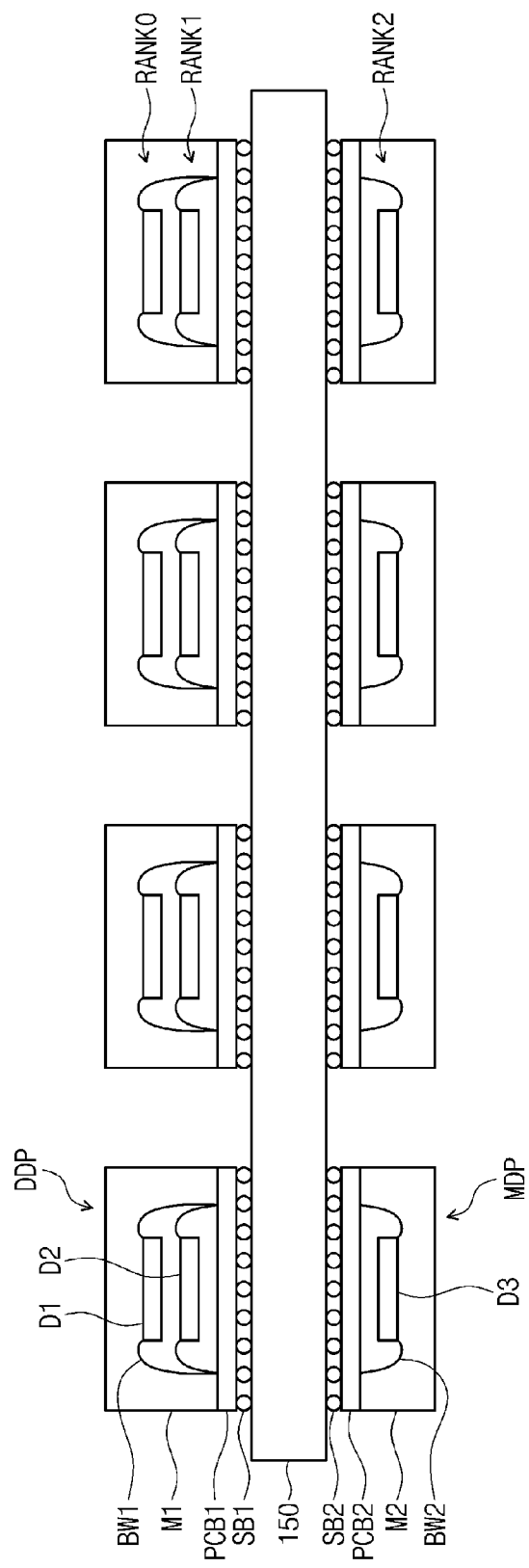
FIG. 14 illustrates forms of packages mounted on a memory module, according to an exemplary embodiment of the inventive concept.

FIG. 14 illustrates forms of packages mounted on a memory module, according to an exemplary embodiment of the inventive concept.

The memory module illustrated in FIG. 14 may be, for example, a DIMM, a registered DIMM (RDIMM), or a fully buffered DIMM (FBDIMM). The exemplary embodiment of FIG. 14 illustrates a memory module that provides three ranks RANK0, RANK1, and RANK2. However, exemplary embodiments of the inventive concept are not limited thereto.

In exemplary embodiments, when each DRAM of the memory module is configured to perform a rank interleaving operation according to an exemplary embodiment of the inventive concept, the three ranks RANK0, RANK1, and RANK2 may be used as six ranks or nine ranks.

Referring to FIG. 14, the memory module may include a printed circuit board 150, a plurality of DDPs, and a plurality of MDPs.

First and second dies D1 and D2 may be packaged in one DDP. The DDPs may be mounted on one side of the printed circuit board 150. In an exemplary embodiment, the DDPs may provide the two ranks RANK0 and RANK1. When a rank interleaving operation is performed, each DDP may provide four ranks.

One die D3 may be packaged in one MDP. The MDPs may be mounted on an opposite side of the printed circuit board 150 relative to the DDPs. In an exemplary embodiment, the MDPs may constitute one rank RANK2. When a rank interleaving operation is performed, each MDP may provide two ranks.

Each of the DDPs may include a printed circuit board PCB1, memory dies D1 and D2, bonding wires BW1, a molding M1, and solder balls SB1. The memory die D1 may be stacked on the memory die D2 on the printed circuit board PCB1 or vice versa. Each of the memory dies D1 and D2 may be connected to the printed circuit board PCB1 through the bonding wires BW1. The molding M1 may protect the printed circuit board PCB, the memory dies D1 and D2, and the bonding wires BW1 by encapsulating the printed circuit board PCB1, the memory dies D1 and D2, and the bonding wires BW1.

The solder balls SB1 may be electrically connected with the memory dies D1 and D2 through the printed circuit board PCB1 and the bonding wires BW1. The solder balls SB1 may be electrically connected with the printed circuit board 150.

The memory dies D1 of the DDPs may constitute one rank RANK0, and the memory dies D2 of the DDPs may constitute another rank RANK1.

Each of the MDPs may include a printed circuit board PCB2, memory die D3, bonding wires BW2, a molding M2, and solder balls SB2. The memory die D3 may be mounted on the printed circuit board PCB2. The memory die D3 may be connected to the printed circuit board PCB2 through the bonding wires BW2. The molding M2 may protect the printed circuit board PCB2, the memory die D3, and the bonding wires BW2 by encapsulating the printed circuit board PCB2, the memory die D3, and the bonding wires BW2. The solder balls SB2 may be electrically connected with the memory die D3 through the printed circuit board PCB2 and the bonding wires BW2. The solder balls SB2 may be electrically connected with the printed circuit board 150.

The memory dies D3 of the MDPs may constitute one rank RANK2. In an exemplary embodiment, heterogeneous memory packages (for example, the MDP and the DDP) may be used in a memory module. However, exemplary embodiments of the inventive concept are not limited thereto. For example, in exemplary embodiments, one type of memory package (for example, either the MDP or the DDP) may be used in a memory module.

The exemplary embodiment of FIG. 14 illustrates the DDPs and the MDPs used in the memory module. However, exemplary embodiments of the inventive concept are not limited to the packages illustrated in FIG. 14. For example, in exemplary embodiments, the DDPs may include the two memory dies D1 and D2 or three or more memory dies. A detailed structure, such as locations and a connection method of the DDP, may be changed according to various other packaging methods. The MDP may include one memory die D3. A detailed structure, such as a location and a connection method of the MDP, may be changed according to various other packaging methods.

Figure 15:
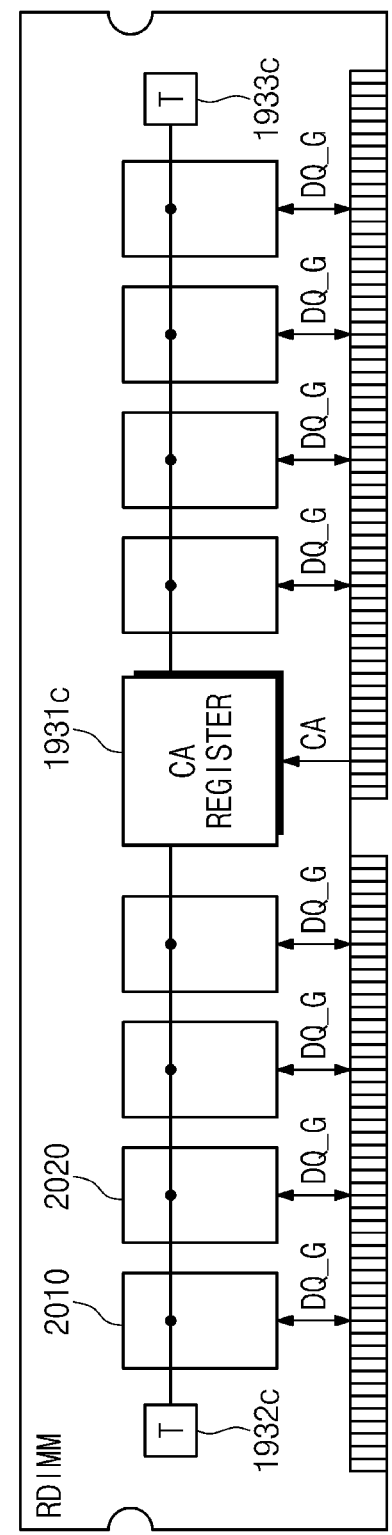
FIG. 15 is a diagram illustrating a path through which a command/address signal of a registered DIMM (RDIMM) is applied in common, according to an exemplary embodiment of the inventive concept.

FIG. 15 is a diagram illustrating a path through which a command/address signal of an RDIMM is applied in common, according to an exemplary embodiment of the inventive concept.

According to an exemplary embodiment of the inventive concept, the command/address signal C/A may be applied in common to the plurality of semiconductor memory devices 2010 and 2020. The command/address signal C/A may be used in common in memory areas of each semiconductor memory device.

Referring to FIG. 15, a memory module 1500 may be an RDIMM. The memory module 1500 may include the plurality of semiconductor memory devices 2010 and 2020 and a command/address register 1931c.

The input/output terminals of the semiconductor memory device 2010 may be connected to input/output pins DQ_G of a chip. As illustrated in FIG. 15, the command/address register 1931c may be connected to a command/address transmission line CA and may provide the command/address signal C/A to the semiconductor memory devices 2010 and 2020. Module termination resistor units 1932c and 1933c may be disposed at opposite ends of the command/address transmission lines CA. Furthermore, the command/address register 1931c may be connected to the semiconductor memory devices 2010 and 2020 in the form of a daisy chain connection scheme.

Figure 16:
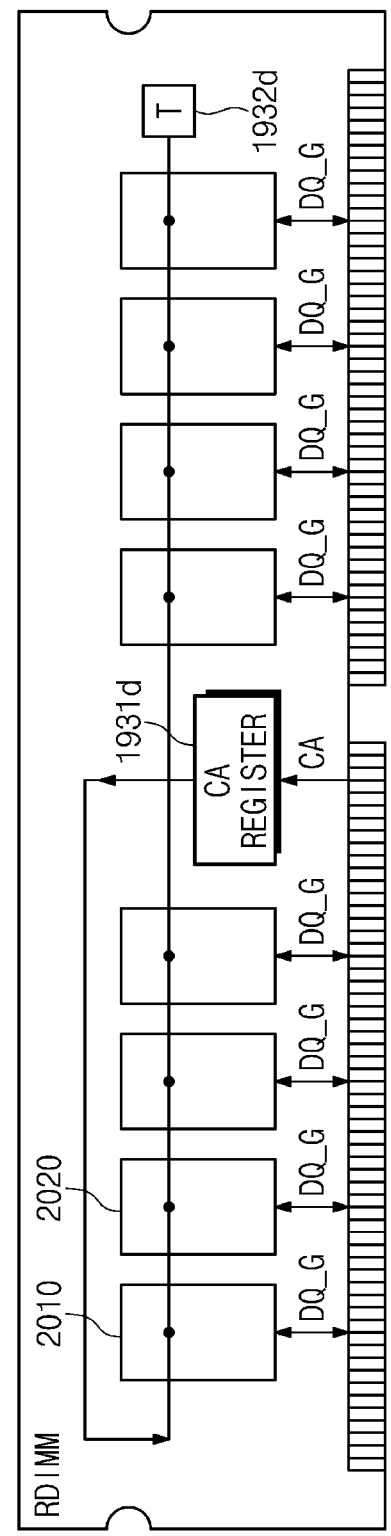
FIG. 16 is a diagram illustrating a path through which a command/address signal of an RDIMM is applied, according to an exemplary embodiment of the inventive concept.

FIG. 16 is a diagram illustrating a path through which a command/address signal of an RDIMM is applied, according to an exemplary embodiment of the inventive concept.

According to an exemplary embodiment of the inventive concept, the command/address signal C/A may be applied in common to the plurality of semiconductor memory devices 2010 and 2020. The command/address signal C/A may be used in common in memory areas of each semiconductor memory device.

Referring to FIG. 16, a memory module 1600 may be an RDIMM. The memory module 1600 may include the plurality of semiconductor memory devices 2010 and 2020 and a command/address register 1931d.

The input/output terminals of the semiconductor memory device 2010 may be connected to input/output pins DQ_G of a chip.

As illustrated in FIG. 16, the command/address register 1931d may be connected to a command/address transmission line CA and may provide a command/address signal to the semiconductor memory devices 2010 and 2020. A module termination resistor unit 1932d may be mounted at an end of the command/address transmission line CA. Furthermore, the command/address register 1931d may be connected to the semiconductor memory devices 2010 and 2020 in the form of a fly-by or daisy chain connection scheme.

Figure 17:
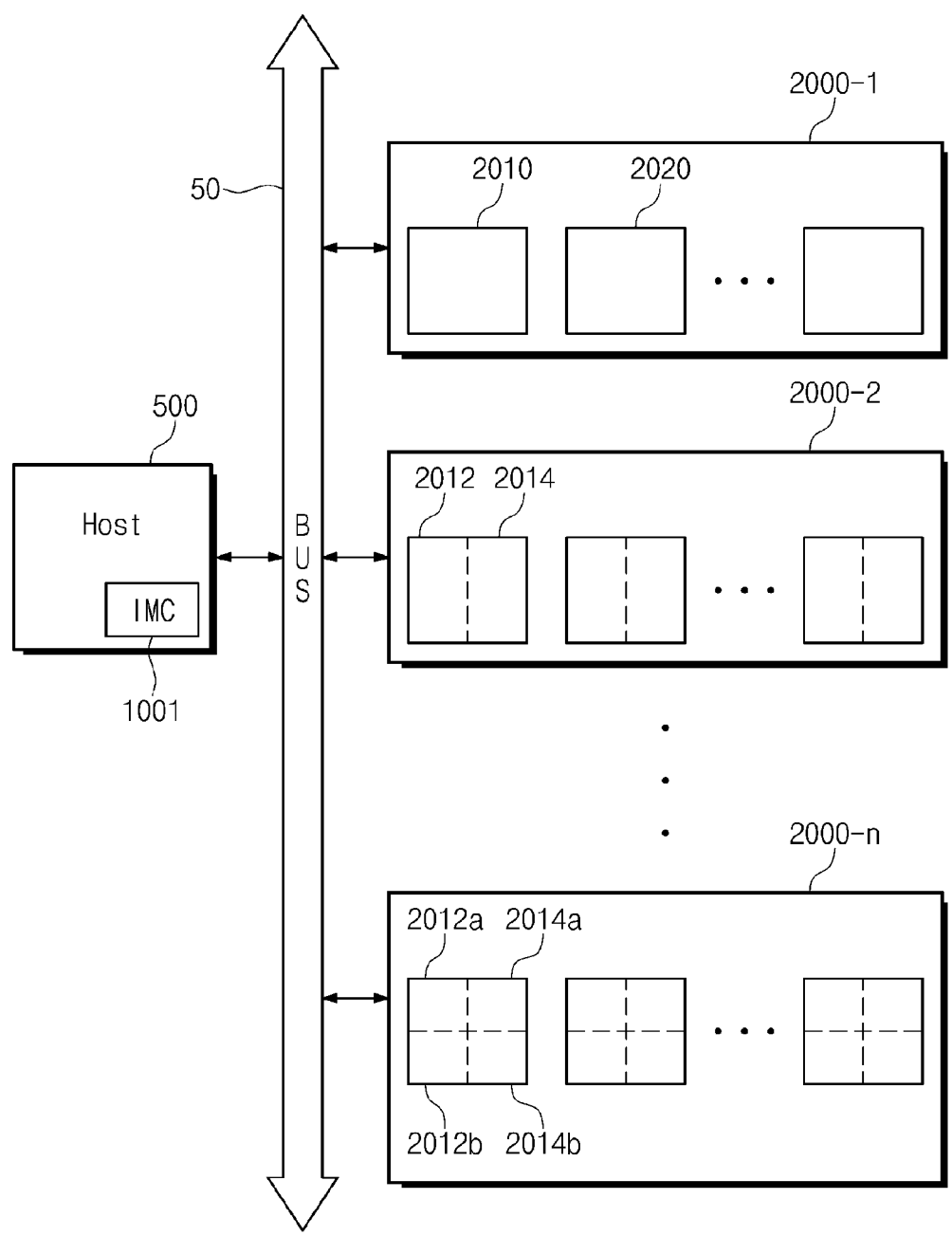
FIG. 17 is a block diagram of an exemplary computing system that includes the memory modules according to exemplary embodiments of the inventive concept.

FIG. 17 is a block diagram of an exemplary computing system that includes the memory modules according to the exemplary embodiments of the inventive concept described herein.

Referring to FIG. 17, the computing system may include the host 500, which includes an internal memory controller (IMC) 1001, a bus 50 connected to the host 500, and a plurality of memory modules 2000-1, 2000-2, and 2000-n connected to the bus 50. In the exemplary embodiment of FIG. 17, n is a natural number equal to at least 3. However, the number of memory modules in the computing system is not limited to the exemplary embodiment of FIG. 17. For example, in exemplary embodiments, the computing system may include only the memory module 2000-1, or only the memory modules 2000-1 and 2000-2.

According to an exemplary embodiment of the inventive concept, the plurality of semiconductor memory devices 2010 and 2020 may be mounted on one side of the memory module 2000-1. Each of the plurality of semiconductor memory devices 2010 and 2020 may be implemented with a single chip. The plurality of semiconductor memory devices 2010 and 2020 may belong to a single-rank.

Furthermore, a plurality of semiconductor memory devices, each of which is implemented with a single chip and has the two bank groups 2012 and 2014, which are independently accessible, may be mounted on one side of the memory module 2000-2. The two bank groups 2012 and 2014 may belong to a dual-rank.

Furthermore, a plurality of semiconductor memory devices, each of which is implemented with a single chip and has the four bank groups 2012a, 2012b, 2014a and 2014b, which are independently accessible, may be mounted on one side of the memory module 2000-n. Even though four bank groups are implemented in a single chip, each of the four bank groups may operate as a separate chip. The four bank groups may belong to a quad-rank.

According to exemplary embodiments of the inventive concept, a rank interleaving operation may be performed in a semiconductor memory device that is mounted on a memory module in the form of a chip, which may result in improved flexibility of the memory module.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor memory device, comprising:
a first memory area in the semiconductor memory device;
a second memory area in the semiconductor memory device, wherein the second memory area is accessed independently of the first memory area based on a usage selecting signal,
wherein the first and second memory areas share command and address lines, and perform a rank interleaving operation based on the usage selecting signal;
a shared command decoder connected to the first memory area and the second memory area;
a first controller connected to the first memory area;
a second controller connected to the second memory area; and
a data communication (DQ) connection circuit configured to receive the usage selecting signal, separate input/output paths corresponding to the first and second memory areas from each other at an output stage when the usage selecting signal indicates that the first and second memory areas belong to a same rank, and integrate the input/output paths with each other at the output stage when the usage selecting signal indicates that the first and second memory areas belong to different ranks,
wherein a first chip select signal is transmitted from outside of the semiconductor memory device to the first memory area through the first controller without being transmitted through the shared command decoder, and a second chip select signal that is different from the first chip select signal is transmitted from outside of the semiconductor memory device to the second memory area through the second controller without being transmitted through the shared command decoder, and
wherein the semiconductor memory device is mounted on a memory module in the form of a single chip.

2. The semiconductor memory device of claim 1, wherein the first memory area belongs to and operates within a first rank in the memory module, and the second memory area belongs to and operates within a second rank in the memory module.

3. The semiconductor memory device of claim 2, wherein the memory module is a dual in-line memory module (DIMM).

4. The semiconductor memory device of claim 1, wherein each of the first and second memory areas includes a plurality of memory banks.

5. The semiconductor memory device of claim 1, wherein the first memory area receives a first on-die termination signal, and the second memory area receives a second on-die termination signal that is different from the first on-die termination signal.

6. The semiconductor memory device of claim 1, wherein the first memory area receives a first clock enable signal, and the second memory area receives a second clock enable signal that is different from the first clock enable signal.

7. The semiconductor memory device of claim 1, wherein the first and second memory areas are packaged in a mono die package (MDP).

8. The semiconductor memory device of claim 1, wherein the first memory area belongs to and operates within a dual-rank or a quad-rank in the memory module.

9. The semiconductor memory device of claim 1, wherein the usage selecting signal is applied as a mode register set signal or is defined by a fuse option or a metal option.

10. A semiconductor memory device, comprising:
a first memory area in the semiconductor memory device;
a second memory area in the semiconductor memory device; and
a data communication (DQ) connection circuit configured to receive a usage selecting signal, separate input/output paths corresponding to the first and second memory areas from each other at an output stage when the usage selecting signal indicates that the first and second memory areas belong to a same rank, and integrate the input/output paths with each other at the output stage when the usage selecting signal indicates that the first and second memory areas belong to different ranks,
wherein the first and second memory areas selectively operate as two different semiconductor chips,
wherein the first and second memory areas receive a same command and address signal,
wherein the first memory area receives a first chip select signal, a first clock enable signal, and a first termination control signal from outside of the semiconductor memory device, and the second memory area receives a second chip select signal, a second clock enable signal, and a second termination control signal from outside of the semiconductor memory device,
wherein the first chip select signal is different from the second chip select signal, the first clock enable signal is different from the second clock enable signal, and the first termination control signal is different from the second termination control signal,
wherein the first and second memory areas belong to and operate within the same rank or within the different ranks based on the usage selecting signal,
wherein the semiconductor memory device is mounted on a memory module in the form of a single chip.

11. The semiconductor memory device of claim 10, wherein the first memory area belongs to a first rank when the second memory area belongs to a second rank.

12. The semiconductor memory device of claim 10, wherein each of the first and second memory areas has a memory capacity of 8 Gb (gigabit) when a memory capacity of the semiconductor memory device is 16 Gb.

13. The semiconductor memory device of claim 10, wherein the semiconductor memory device is packaged in a registered dual in-line memory module (RDIMM).

14. A memory module, comprising:
a substrate; and
a plurality of semiconductor memory devices mounted on the substrate, wherein the semiconductor memory devices are spaced apart from one another on one side or opposite sides of the substrate,
wherein each of the semiconductor memory devices comprises:
a first bank group formed of a first portion of the semiconductor memory device;
a second bank group formed of a second portion of the semiconductor memory device, wherein the first portion is different from the second portion, and the first and second bank groups are accessed independently of each other based on a usage selecting signal,
wherein the first and second bank groups share command and address lines and perform a rank interleaving operation based on the usage selecting signal;
a shared command decoder configured to decode command and address signals applied through the shared command and address lines;
a first bank group controller configured to receive decoded output signals of the shared command decoder, a first chip select signal, a first clock enable signal, and a first termination control signal; and
a data communication (DQ) connection circuit configured to receive the usage selecting signal, separate input/output paths corresponding to the first and second bank groups from each other at an output stage when the usage selecting signal indicates that the first and second bank groups belong to a same rank, and integrate the input/output paths with each other at the output stage when the usage selecting signal indicates that the first and second bank groups belong to different ranks,
wherein the first chip select signal, the first clock enable signal, and the first termination control signal control the first bank group,
wherein the first chip select signal, the first clock enable signal, and the first termination control signal are transmitted from outside of the semiconductor memory device to the first bank group through the first bank group controller without being transmitted through the shared command decoder.

15. The memory module of claim 14, wherein the memory module is a dual in-line memory module (DIMM).

16. The memory module of claim 14, wherein the first bank group comprises 16 memory banks.

* * * * *